US011672076B2

United States Patent
Yokoi et al.

(10) Patent No.: US 11,672,076 B2
(45) Date of Patent: Jun. 6, 2023

(54) COMPONENT CARRIER WITH PROTRUDING THERMALLY CONDUCTIVE TONGUE AND CORRESPONDING METHOD OF MANUFACTURING

(71) Applicant: AT&S Austria Technologie & Systemtechnik Aktiengesellschaft, Leoben (AT)

(72) Inventors: Naoto Yokoi, Tokyo (JP); Raymond Yi, Penglai (CN); Sabine Liebfahrt, Parschlug (AT); Christian Vockenberger, Leoben (AT); Ferdinand Lutschounig, Ferlach (AT); Bernhard Reitmaier, Pölstal/Möderbrugg (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 17/443,235

(22) Filed: Jul. 22, 2021

(65) Prior Publication Data
US 2022/0030697 A1 Jan. 27, 2022

(30) Foreign Application Priority Data
Jul. 23, 2020 (EP) .................................... 20187427

(51) Int. Cl.
*H05K 1/02* (2006.01)
*H05K 3/30* (2006.01)
*H05K 3/46* (2006.01)

(52) U.S. Cl.
CPC ........... *H05K 1/0204* (2013.01); *H05K 3/301* (2013.01); *H05K 3/303* (2013.01); *H05K 3/4644* (2013.01); *H05K 3/4697* (2013.01)

(58) Field of Classification Search
CPC ...... H05K 1/0204; H05K 3/301; H05K 3/303; H05K 3/4644; H05K 3/4697
(Continued)

(56) References Cited

U.S. PATENT DOCUMENTS

2008/0019102 A1   1/2008   Yurko
2009/0141456 A1   6/2009   Juett
(Continued)

FOREIGN PATENT DOCUMENTS

DE   102012216257 A1   3/2014
WO   2005002302 A1    1/2005
(Continued)

OTHER PUBLICATIONS

Tomezak, A.; Extended European Search Report in Application EP 20 18 7427.8; pp. 1-7; Jan. 22, 2021; European Patent Office; 80298, Munich, Germany.

*Primary Examiner* — Andargie M Aychillhum
(74) *Attorney, Agent, or Firm* — Robert A. Blaha; Smith Tempel Blaha LLC

(57) ABSTRACT

A method of manufacturing a component carrier includes (i) forming a stack having at least one electrically conductive layer structure and/or at least one electrically insulating layer structure; (ii) assembling a component to the stack; and (iii) forming a thermally conductive tongue having an embedded portion embedded in the stack and having an exposed portion protruding beyond the stack, where a first width of the tongue in the embedded portion is different from a second width of the tongue in the exposed portion. A corresponding component carrier includes analogous features.

18 Claims, 9 Drawing Sheets

(58) Field of Classification Search
USPC .......................................................... 174/252
See application file for complete search history.

(56) References Cited

U.S. PATENT DOCUMENTS

| | | | |
|---|---|---|---|
| 2013/0146352 A1* | 6/2013 | Lassmann | ............ H05K 1/0201 |
| | | | 174/547 |
| 2014/0145565 A1* | 5/2014 | Gottwald | ............... H02K 9/227 |
| | | | 361/748 |
| 2015/0366102 A1* | 12/2015 | Ishihara | ............... H05K 1/0207 |
| | | | 29/829 |
| 2016/0192471 A1 | 6/2016 | Min et al. | |
| 2018/0190563 A1 | 7/2018 | Magni | |
| 2020/0324361 A1* | 10/2020 | Scelfo | .................... B23K 20/04 |

FOREIGN PATENT DOCUMENTS

| | | | | |
|---|---|---|---|---|
| WO | WO-2005002302 A1 * | 1/2005 | ........... | H05K 1/0207 |
| WO | WO-2005123932 A2 * | 12/2005 | .............. | C12P 11/00 |

* cited by examiner

COMPONENT CARRIER WITH PROTRUDING THERMALLY CONDUCTIVE TONGUE AND CORRESPONDING METHOD OF MANUFACTURING

CROSS-REFERENCE TO RELATED APPLICATION

The present application claims the benefit of the filing date of the European Patent Application No. 20187427.8, filed Jul. 23, 2020, the disclosure of which is hereby incorporated herein by reference.

TECHNICAL FIELD

Embodiments of the invention generally relate to the technical field of component carriers as mechanical support structures for electronic components and for electrically contacting electronic components. Specifically, embodiments of the invention relate to component carriers with one or more protruding thermally conductive tongues and methods for manufacturing the same.

TECHNOLOGICAL BACKGROUND

Rapidly ongoing miniaturization in combination with increasing electronic functionality—particularly in high-end applications—leads to the need for progress in cooling technology for different types of component carriers such as printed circuit boards (PCBs). Improved thermal performance of PCBs should allow to remove the power loss from components in such a way that their maximum temperature during operation does not exceed allowed levels. Heat decentralization, i.e., heat spreading and heat guiding in the PCB, is one opportunity to achieve high cooling effectiveness from passive systems.

Conventionally, heat is guided from heat generating regions of a component carrier to the surface of the component carrier by heat guiding elements within the component carrier, for example by vias filled with heat-conducting material or by heat conducting layer structures. Such vias or layer structures may for example be thermally connected to thermal pads arranged on a surface of the component carrier. Heat sinks, e.g., metal structures with pins or fins, may be mounted to the thermal pads in order to dissipate heat from the component carrier to the surroundings.

Such conventional heat dissipation requires a number of different heat guiding and heat spreading elements or structures both within the component carrier and mounted to the component carrier. Designing and implementing proper heat dissipation pathways via such rather complex arrangements of heat guiding and heat spreading elements can be technologically challenging and may also be costly. Furthermore, respective interfaces between the different heat guiding and heat spreading elements may interfere with the heat flow, e.g., due to material discontinuities or small air pockets trapped at those interfaces.

SUMMARY

There may be a need for component carriers with a simple design, which at the same time remove heat effectively from heat generating areas of the component carrier or from heat generating elements such as electronic components attached to and/or embedded within the component carrier.

According to an aspect of the invention, a method of manufacturing a component carrier comprises: (i) forming a stack comprising at least one electrically conductive layer structure and/or at least one electrically insulating layer structure; (ii) assembling a component to the stack; and (iii) forming a thermally conductive tongue. The thermally conductive tongue has an embedded portion embedded in the stack and has an exposed portion protruding beyond the stack, wherein a first width of the tongue in the embedded portion is different from, in particular larger than, a second width of the tongue in the exposed portion.

According to a further aspect of the invention, a component carrier comprises (i) a stack comprising at least one electrically conductive layer structure and/or at least one electrically insulating layer structure; (ii) a component assembled to the stack; and (iii) a thermally conductive tongue having an embedded portion embedded in the stack and having an exposed portion exposed with respect to the stack, wherein a first width of the tongue in the embedded portion is different from, in particular larger than, a second width of the tongue in the exposed portion.

OVERVIEW OF EMBODIMENTS

In the context of the present application, the term "component carrier" may denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The component carrier comprises a "stack" of at least one electrically insulating layer structure and/or at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

The term "layer structure" may denote a continuous layer, a patterned layer or a plurality of non-consecutive islands within a common plane. The different layer structures are stacked on top of each other in a "stacking direction". The stacking direction of the component carrier or stack is parallel to the surface normal of the main surfaces of the layer structures and/or the main surfaces of the stack. A "main surface" of a layer, layer structure or stack may be either one of those two surfaces, which have the largest extension compared with the other surfaces. The main surface may be defined as a surface perpendicular to the stacking direction. A "side surface" of a layer, layer structure or stack may be any external surface, which is not a main surface. A side surface may be any external surface which is perpendicular to a main surface and/or which extends along the stacking direction. A "vertical direction" may be defined with respect to a given stack as being parallel to the stacking direction. A "horizontal direction" may be defined with respect to a given stack as any direction perpendicular to the stacking direction.

A "component" may be an electronic component, which may be any physical entity forming part of an electronic system. An electronic component may have one or more electrical terminals or leads, configured for electrically contacting the electronic component. It may comprise one or more electronic circuits which may be configured to implement a particular function or subfunction of the component, in particular in the context of the electronic system. A component may itself comprise one or more subcomponents being themselves components. It may comprise a carrier for mechanical stabilization of the component, as a support structure for different parts of the component and/or for electrically connecting different parts of the component. A component may comprise a housing and/or encapsulation protecting the component from external influences, e.g., mechanical or electromagnetic influences. A component may be an active, passive or electromechanical component.

The component may be surface mounted to the stack, e.g., at a top or bottom surface of the stack with respect to the stacking direction or at a side surface of the stack with respect to the stacking direction. The component may be at least partly, in particular fully, embedded in the component carrier. It may be arranged in a recess or a cavity of the component carrier. When embedded, the entire surface of the component may be in contact with the stack, or at least parts of the surface of the component may not be in contact with the stack. The component may be separated from the stack by a gap which may be defined by the cavity or recess, in which the component is arranged.

In the context of the present application, the term "thermally conductive tongue" may denote any element or structure having a portion that is embedded in a stack and a portion that is exposed from a stack. The tongue may be an inlay-tongue or a levitating inlay. It may be formed in one piece. It may be formed as a monolithic tongue. The tongue may be made from a homogeneous material. Alternatively, the tongue may comprise different regions made from different materials. The tongue may comprise an outer part and an inner or core part, wherein the outer part at least partially, in particular fully, surrounds the inner part. The inner and outer parts may comprise different materials. The outer part may comprise one or more solid materials. The inner part may comprise one or more cavities, which may be filled with one or more fluid materials such as a cooling fluid, in particular one or more gaseous and/or liquid materials.

The tongue may have a layer-like or sheet-like form having a small thickness in comparison with both length and width of the tongue. The tongue may be formed as a bar, i.e., as a straight piece that is longer than it is wide, in particular with a length of the tongue that is large in comparison with both width and thickness of the tongue. The tongue may be essentially flat or planar, but it may also be bent and/or it may be twisted. The tongue may be bent at least once, in particular several times, for example around an axis that extends along the width and/or length of the tongue. The tongue may be bent around an axis perpendicular to the stacking direction, in particular so that the exposed portion of the tongue extends along the side of the stack from which the tongue protrudes. The latter may lead to an especially compact arrangement of the tongue.

The tongue is thermally conductive and may thus serve as a heat guiding bar. Thermal conductivity is a measure of the ability to conduct heat. The entire tongue may be thermally conductive. A thermally conductive tongue may also be a tongue, which has defined thermal pathways, e.g., from one end of the tongue to an opposite end, while some parts of the tongue may not be thermally conductive. A material may be defined as "thermally conductive" if its thermal conductivity is larger than 0.1 W/mK, in particular larger than 1 W/mK, in particular larger than 10 W/mK. Additionally, a material may be defined as "thermally conductive" if its thermal conductivity is smaller than 15000 W/mK. The tongue may be thermally coupled with the component.

An "exposed portion" of the tongue is a portion that protrudes beyond the stack. The exposed portion may protrude from a side surface of the stack and/or it may protrude from a main surface of the stack. The exposed portion may be formed as one piece or it may comprise several parts, which protrude from different surface portions of the stack, in particular from different surfaces of the stack. These different parts may be connected by the embedded portion. All external surfaces of the exposed portion may be exposed to an environment. Alternatively, at least a part of the external surface of the exposed portion may be in contact with the stack. The exposed portion of the tongue may be linked with the embedded portion at a side of the exposed portion forming an interface between both portions. This side of the exposed portion forming the interface may lie within a plane of the side of the stack from which the exposed portion protrudes. The exposed portion may be straight or flat. It may be bent, in particular with respect to the embedded portion, and/or it may be twisted. The exposed portion may have a convex form. It may have a form lacking any concave surface features such as recesses or holes. Alternatively, it may have at least one hole and/or at least one recess.

An "embedded portion" of the tongue is a portion that is embedded in the stack. The embedded portion may be fully embedded in the stack. All external surfaces of the embedded portion may be covered by the stack. The entire surface of the embedded portion may be in contact with the stack, or at least parts of the surface of the embedded portion may not be in contact with the stack. The embedded portion may be arranged in a recess or a cavity of the stack. The embedded portion may be separated from the stack by a gap which is defined by the cavity or recess, in which the embedded portion is arranged. There may be a hole in the stack laying bare or exposing some of the surface of the embedded portion. Part of the surface of the embedded portion may be exposed at a surface of the stack. The embedded portion may form an entire layer of the stack or it may form only part of a layer of the stack. The embedded portion may form a layer of the stack together with one or more layer structures of the stack, arranged laterally from the embedded portion. The embedded portion may be arranged laterally from an electrically insulating layer structure of the stack and/or an electrically conductive layer structure of the stack, wherein the electrically insulating layer structure and/or the electrically conductive layer structure may consist of a material different from the material of the embedded portion.

The embedded portion may be thermally coupled to one or more heat generating areas of the component carrier. It may be configured to remove heat from these heat generating areas. For this, it may comprise different parts linking with different heat generating areas. These different parts may for example be arranged in a fork-like form. The embedded portion may have at least one recess and/or at least one hole. The embedded portion of the tongue may be thermally coupled with the component, which may be heat generating. The embedded portion may be in direct, physical contact with the component, i.e., touch the component, and/or it may be thermally coupled with the component indirectly through other thermally conductive elements such as thermally conductive vias and/or thermally conductive layer structures. The embedded portion may be electrically isolated from the component or it may be electrically connected to the component.

A "width" of the tongue may refer to an extension of the tongue that is parallel to the side of the stack from which the tongue protrudes. The width may refer to an extension of the tongue that is perpendicular to the stacking direction and parallel to the side of the stack from which the exposed portion protrudes. The width may refer to the largest extension of a cross-section of the tongue, in particular of a cross-section at the interface between the embedded portion and the exposed portion. If the cross-section of the tongue at the interface between embedded and exposed portion has a rectangular form, the width may refer to any extension that is parallel to one of the sides of the cross-section, in particular parallel to the larger side or parallel to the smaller side. A "length" of the tongue can be defined as a dimension perpendicular to the side of the stack from which the tongue protrudes.

The tongue may have different widths at different locations in length-direction of the tongue. The embedded portion may have several widths, of which any one can be defined to be the "first width". In particular, the largest width of the embedded portion may be defined as the first width. Similarly, the exposed portion may have several widths, of which any one can be defined to be the "second width". In particular, the largest width may be defined as the second width. The tongue may have exactly two widths. A transition between different widths, in particular between the first and the second widths, may be abrupt or it may be gradual.

The first width may be larger than the second width. Then, a "wider portion" of the tongue may be defined as the portion of the tongue having the first width or as the portion of the tongue having a width that is larger or equal to the first width. Similarly, a "narrower portion" of the tongue may be defined as the portion of the tongue having the second width or as the portion of the tongue having a width that is smaller or equal to the second width. The wider portion may coincide with the embedded portion. The wider portion may comprise the embedded portion, the embedded portion may comprise the wider portion, and/or only a part of the embedded portion may comprise only a part of the wider portion. Similarly, the narrower portion may coincide with the exposed portion. The narrower portion may comprise the exposed portion, the exposed portion may comprise the narrower portion, and/or only a part of the exposed portion may comprise only a part of the narrower portion.

Alternatively, the first width may be smaller than the second width. Then, a "wider portion" of the tongue may be defined as the portion of the tongue having the second width or as the portion of the tongue having a width that is larger or equal to the second width. Similarly, a "narrower portion" of the tongue may be defined as the portion of the tongue having the first width or as the portion of the tongue having a width that is smaller or equal to the first width. The wider portion may coincide with the exposed portion. The wider portion may comprise the exposed portion, the exposed portion may comprise the wider portion, and/or only a part of the exposed portion may comprise only a part of the wider portion. Similarly, the narrower portion may coincide with the embedded portion. The narrower portion may comprise the embedded portion, the embedded portion may comprise the narrower portion, and/or only a part of the embedded portion may comprise only a part of the narrower portion.

The wider portion, the narrower portion, the exposed portion and/or the embedded portion may be formed as rectangular cuboids, for which each of the faces or sides is a rectangle and each pair of adjacent faces meets in a right angle. The whole tongue may have the form of a rectangular cuboid, in particular a broadly rectangular cuboid with one or more stepped edges at the transition between the wider portion and the narrower portion.

An advantage of the above-described component carrier may be that the tongue provides a heatspreading/heatguiding area that can be easily connected to a housing. The tongue may provide easy connection to heat removal areas. It may lead to less thermal resistances than conventional heat removal structures. The use of solder paste with good thermal conductivity may be possible. Furthermore, it may be possible to combine highly integrated PCBs with thermally conductive inlays.

The above-described method of manufacturing a component carrier as well as the above-described component carrier may further be advantageous for a particularly effective heat transport or heat flow from heat generating parts of the component carrier or from heat generating components assembled to the component carrier. Such effective heat removal may guarantee that one or more temperatures of the component carrier and/or of components assembled to the component carrier remain below a given critical temperature threshold or below respective critical temperature thresholds. In this way, the risk of damage to the component carrier and/or components due to overheating may be reduced.

A thermally conductive tongue may provide particularly effective heat removal, since a portion of the tongue is exposed from the stack. The exposed portion may have a substantial external surface, from which heat can be effectively dispersed to an environment. The heat removal may be further improved, since a portion of the tongue is embedded in the stack. The embedded portion may be particularly effective for removing heat from an interior of the component carrier, in which heat may otherwise accumulate potentially leading to structural damage to the component carrier and/or components. To this effect, the embedded part may for example be arranged close to heat generating areas or heat guiding elements within the stack.

Furthermore, a thermally conductive tongue may cool in a particularly effective way, e.g., if the tongue is formed as a single piece or structure, in particular if there are no material discontinuities within the tongue, for example at the interface between the embedded and the exposed portions. A material discontinuity, e.g., a transition from one material to another material or a transition region with small inhomogeneities, e.g., small air pockets, could substantially interfere with a heat flow from the interior of the stack. Conventional methods for heat removal from a stack usually comprise several such material discontinuities, e.g., between a thermally conductive via and a pad or between a pad and a heat sink mounted to the pad.

According to an embodiment of the invention, the first width is larger than the second width.

To form the embedded portion with a larger first width than the second width of the exposed portion may allow for a particularly robust attachment of the tongue to the stack, in particular when compared with a configuration in which the embedded portion is substantially narrower than the exposed portion or even with a configuration where they are of equal width. The mentioned feature of the first width being larger than the second width may also result from a particularly simple and efficient process with which the tongue may be formed. For example, it may result from a cutting of the tongue at the exposed portion, when a part of the stack initially covering the exposed portion is removed.

According to a further embodiment of the invention, the second width is larger than the first width. Forming the exposed portion with a larger second width than the first width of the embedded portion may allow for a more effective transport of heat from the interior of the component carrier.

According to a further embodiment of the invention, a transition between the first width and the second width is at an interface between the embedded portion and the exposed portion. The transition may be abrupt or it may be gradual within a transition region.

That the transition is at the interface between embedded and exposed portions may result from a particularly simple and efficient process with which the tongue may be formed. It may result from the removal of a part of the original stack initially covering the exposed portion. In particular, a circumferential portion or peripheral portion of the original tongue may be cut and removed when removing the part of the stack originally surrounding the exposed portion. Removing the peripheral portion of the tongue may be useful in order to fully remove all material of the stack from the exposed portion. Thereby, a particularly clean surface of the exposed portion may result without any residues from the stack, which may of course improve heat dissipation from the exposed portion.

The removal of the peripheral part of the original tongue may result in the exposed portion having a smaller width than the embedded portion. It may further result in the transition between first and second widths being at the interface between the embedded and exposed portions. Forming the transition at the interface between embedded and exposed portions may also be advantageous to further improve the particularly robust attachment of the tongue to the stack.

According to a further embodiment of the invention, a stepped edge connects a portion of the tongue having the first width with a portion of the tongue having the second width. If the first width is larger than the second width, then the portion of the tongue having the first width may be the wider portion and the portion of the tongue having the second width may the narrower portion. If the first width is smaller than the second width, then the portion of the tongue having the second width may be the wider portion and the portion of the tongue having the first width may the narrower portion.

The stepped edge may be sharp or rounded. The height of the step may be small in comparison with the first width and/or the second width, it may measure in a range between 50 μm and 250 μm, it may also be larger than 250 μm. The height of the step may be smaller than ⅙th of the first width and/or of the second width. There may be two stepped edges on opposite sides of the tongue together forming the transition between the wider portion and the narrower portion. The narrower portion may protrude between the stepped edges. The one or more stepped edges may be located at the interface between the embedded portion and the exposed portion.

A stepped edge may provide a well-defined and easily producible transition between the narrower and the wider portions of the tongue. Furthermore, the stepped edge may result from a particularly simple and efficient process with which the tongue may be formed. It may result from the removal of a part of the stack initially covering the exposed portion. If the first width is larger than the second width, the stepped edge may result when a peripheral portion of the tongue is removed together with the part of the stack initially covering the exposed portion.

According to a further embodiment of the invention, a ratio between the first width and the second width is larger than 3/4 and smaller than 4/3, in particular larger than 5/6 and smaller than 6/5. Such an embodiment with similar first and second widths may be particularly stable and robust. If the first width is larger than the second width, e.g., due to a manufacturing process, a large second width may be advantageous, since the larger the second width of the exposed portion the larger the overall surface of the exposed portion of the tongue and thus the more heat can be dissipated from the exposed portion.

According to a further embodiment of the invention, a difference between the first width and the second width is in a range between 100 μm and 500 μm. The difference may be small in relation to the first width and/or the second width. Again, this may be advantageous to improve heat removal through the tongue.

According to a further embodiment of the invention, the tongue is electrically insulated from the component. For example, the tongue may consist of an electrically insulating material. At the same time, the tongue may be thermally coupled to the component. Such an embodiment may be advantageous to prevent shorts, which might damage the component and/or component carrier.

According to a further embodiment of the invention, the tongue is electrically coupled with the component. Such an embodiment may be advantageous, since the tongue can at the same time provide an electrical contact to the component as well as serve as a heat spreader removing heat from the component. In other words, the tongue may at the same time serve as a current bar and as a heat guiding bar.

According to a further embodiment of the invention, the tongue is electrically insulating. The tongue may comprise or consist of a dielectric material. Such an embodiment may be advantageous to prevent shorts, for example when the tongue is connected to a casing, a housing, or a cover.

According to a further embodiment of the invention, the tongue is electrically insulated from all structures of the component carrier, which are configured to conduct electrical current. Thus, the tongue may serve only a thermal function, not an electrical function, which may be desirable for a clear and understandable design of the component carrier.

According to a further embodiment of the invention, the exposed portion is thermally coupled with a thermally conductive body outside the component carrier. The thermally conductive body may be a heat spreader or a heat sink. The thermally conductive body may comprise a plurality of fins and/or pins. A casing or a housing may comprise or may be attached to the thermally conductive body. The thermally conductive body may be a casing or a housing. The thermally conductive body may be formed separately from the tongue. It may be attached to the tongue at the exposed portion, in particular removably attached. Such a thermally conductive body may further improve heat flow through the tongue.

According to a further embodiment of the invention, the tongue comprises fins or pins. This may further improve heat removal from the tongue.

According to a further embodiment of the invention, the exposed portion extends from a side surface of the stack. Such an embodiment may for example result, if the tongue is arranged between different layer structures of the stack. This may allow for a particularly robust and simple attachment of the tongue to the stack.

According to a further embodiment of the invention, the tongue extends vertically over a plurality of layer structures of the stack. For example, the tongue may be integrated in a core layer, which may comprise at least one electrically conductive layer structure and at least one electrically isolating layer structure.

According to a further embodiment of the invention, the method further comprises arranging at least one layer structure of the stack below the embedded portion and at least one layer structure of the stack above the embedded portion. This may ensure a particularly robust and simple attachment of the tongue to the stack, for example because the embedded portion of the tongue is sandwiched between the layer structures arranged above and below. The layer structure above the embedded portion may be an electrically conductive layer structure or it may be an electrically insulating layer structure. Equally, the layer structure below the embedded portion may be an electrically conductive layer structure or it may be an electrically insulating layer structure. Above and below may be defined with respect to the stacking direction, wherein above and below may be exchangeable, i.e., can be arbitrarily defined.

According to a further embodiment of the invention, the method further comprises integrating the thermally conductive tongue in a layer structure of the stack, in particular in a cavity, a recess or a through-hole of the layer structure. This layer structure may be on the same level in stacking direction as the thermally conductive tongue. One or both main surfaces of the layer structure may be level with respective main surfaces of the thermally conductive tongue, i.e., these surfaces may lie in a common plane. Alternatively, they may not lie in a common plane. The layer structure may be an electrically conductive layer structure, an electrically insulating layer structure or consist of a plurality of different layer structures arranged above each other.

According to a further embodiment of the invention, the method further comprises embedding a release layer above and below the tongue in the stack, wherein the exposed portion of the tongue is formed by separating and removing a part of the stack from the tongue at the release layer. Above and below may again be defined with respect to the stacking direction. The release layer may be poorly adhesive, in particular poorly adhesive for adjacent layer structures of the stack and/or poorly adhesive for the tongue. It may be easily removable from the tongue. Embedding the release layer may allow for a particularly simple removal of the part of the stack initially covering the exposed portion of the tongue.

The stack, in particular the original stack before the tongue is exposed, may comprise a "disposable part", which is eventually removed, when the exposed portion of the tongue is formed. The stack, in particular the original stack, may comprise a "permanent part", which forms the final or finished stack from which the tongue is exposed. The finished component carrier may comprise the permanent part, but not the disposable part.

The separating may comprise a separating of the disposable part of the stack from the permanent part of the stack and/or from the tongue. It may comprise a separating of the permanent part from the disposable part to form a side surface of the stack, from which the tongue protrudes. The side surface thus formed may be essentially planar. The separating may further comprise a separating of the disposable part from the tongue. It may comprise a separating of a peripheral portion or circumferential portion of the tongue from the exposed portion of the tongue, in particular at side surfaces of the tongue, which are not covered by a release layer.

According to a further embodiment of the invention, the separating comprises cutting, in particular laser cutting and/or milling. A cutting tool for the cutting such as a mill cutter or a laser beam may be arranged in stacking direction. Cuts resulting from the cutting may extend in stacking direction. The entire stack, in particular including the tongue, may be cut in stacking direction, or the cutting may only reach up to a certain depth in stacking direction, for example up to a release layer. Cutting through the entire stack may be used for separating the peripheral portion of the tongue from the exposed portion and/or for separating the disposable part of the stack from the permanent part. It may be used for cutting, where a release layer is not present in stacking direction. Cutting only up to a certain depth may be used for separating the disposable part from the permanent part. It may be used for cutting, where a release layer is present in the stacking direction. Cutting through the entire stack may be performed by milling, while cutting up to a certain depth may be performed by laser cutting.

According to a further embodiment of the invention, the exposed portion is bendable and/or bent. For this, the thickness of the tongue may be in a range between 150 µm and 1.5 mm. A bendable exposed portion may be arrangeable in a compact way, for example in a casing or a housing, while at the same time ensuring adequate heat removal from the component carrier.

According to a further embodiment of the invention, the exposed portion is non-bendable. For this, the thickness of the tongue may be larger than 1.5 mm. A non-bendable exposed portion may be more durable than a bendable exposed portion, which may become brittle.

According to a further embodiment of the invention, a thickness of the tongue is in a range between 50 µm and 5 mm, in particular between 100 µm and 3 mm, in particular between 300 µm and 1.5 mm.

According to a further embodiment of the invention, the method further comprises forming a further thermally conductive tongue. The further thermally conductive tongue may share some or all of the above-described properties of the thermally conductive tongue. In particular, it may have a further embedded portion embedded in the stack and a further exposed portion protruding from the stack. Also, a width of the tongue may be larger in the further embedded portion than in the further exposed portion.

The further embedded portion of the further thermally conductive tongue and the embedded portion of the thermally conductive tongue may be connected, in particular they may be integrally formed. However, the further embedded portion and the embedded portion may also be separately formed. They may or may not be thermally coupled with each other. The further exposed portion of the further thermally conductive tongue may protrude from a surface area of the stack different from the surface area of the stack from which the exposed portion protrudes. The further exposed portion and the exposed portion may protrude from different side surfaces of the stack, in particular from opposite sides. They may be arranged above each other in stacking direction, in particular vertically above each other. The exposed portion and the further exposed portion may be connected by means of a bridge portion, which may be arranged at least partly, in particular fully, outside the stack. The bridge portion may comprise a ring-like structure surrounding at least a fourth of the stack, in particular at least half of the stack, in particular the entire stack.

According to a further embodiment of the invention, a material of the tongue comprises at least one of: an electrically conductive material, an electrically non-conductive material, copper, aluminum, a ceramic such as $Al_2O_3$ or AlN (aluminum nitride), a metallic composite, a bimetal, a non-metallic material, and a magnetic material, in particular a permanent-magnetic material or a soft-magnetic material.

According to a further embodiment of the invention, the tongue consists of an electrically conductive material, an electrically non-conductive material, copper, aluminum, a ceramic such as $Al_2O_3$ or AlN (aluminum nitride), a metallic composite such as rolled aluminum-copper, a bimetal, a non-metallic material, and/or a magnetic material, in particular a permanent-magnetic material or a soft-magnetic material.

According to a further exemplary embodiment, the tongue comprises an inner region, in particular a cavity, filled with a gaseous medium and/or a liquid medium. The tongue may comprise a heat exchanger, for example a heat pipe. The gaseous medium and/or liquid medium may be a working fluid of the heat exchanger, in particular the heat pipe. The heat pipe may be a constant conductance heat pipe, a variable conductance heat pipe, a vapor chamber, a planar heat pipe, a diode heat pipe or a thermosiphon. For the integration of a heat pipe in the tongue, the length of the tongue may need to be larger than 1 cm, in particular larger than 5 cm. Such an embodiment, in particular the integration of a heat pipe in the tongue, may further improve heat removal from the stack.

According to a further exemplary embodiment, the tongue comprises an active heat transferring system, in particular a heat pipe or a vapor chamber.

In the following further considerations are presented which may be relevant at least for some embodiments of the invention.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imagable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imagable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay (such as a ceramic inlay, preferable comprising aluminum nitride or aluminum oxide), an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier. In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold), etc.

Some embodiments have been described with reference to apparatus type claims whereas other embodiments have been described with reference to method type claims. However, a person skilled in the art will gather from the above and the following description that, unless otherwise indicated, any combination of features relating to method type claims with features relating to apparatus type claims is disclosed with this document, both with respect to the apparatus as well as with respect to the method.

The aspects defined above and further aspects of the present invention are apparent from the examples of embodiment to be described hereinafter and are explained with reference to the examples of embodiment.

DETAILED DESCRIPTION OF ILLUSTRATED EMBODIMENTS

Figure 1:
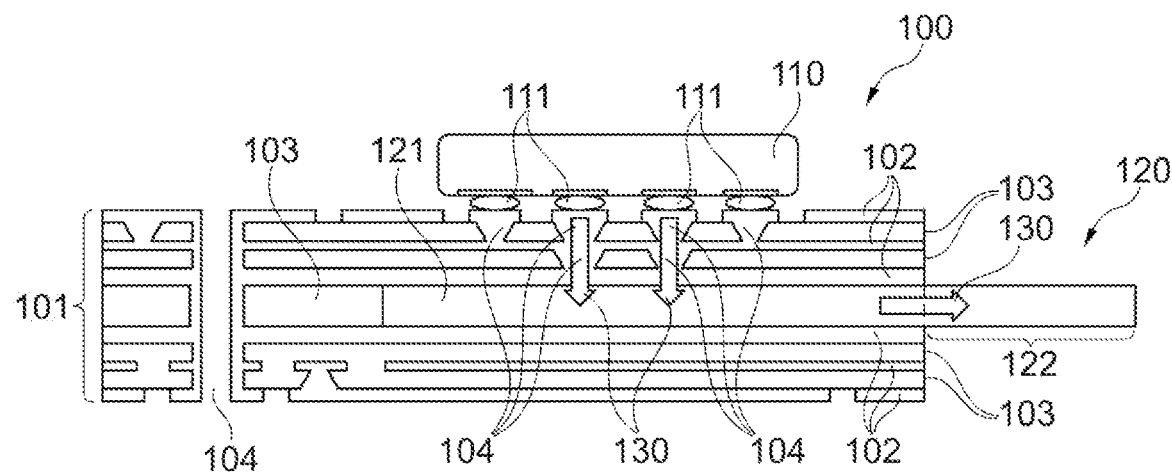
FIG. 1 shows a cross-sectional side view of a component carrier with a thermally conductive tongue according to an exemplary embodiment of the invention.

The illustrations in the drawings are schematically presented. In different drawings, similar or identical elements are provided with the same reference signs. For the sake of clarity and comprehensibility, reference signs are sometimes omitted for those features, for which reference signs have already been provided in earlier figures.

FIG. 1 shows a cross-sectional view of a component carrier 100 with a thermally conductive tongue 120 according to an exemplary embodiment of the invention. The component carrier 100 comprises a stack 101 with electrically conductive layer structures 102 and electrically insulating layer structures 103. Vias 104 connecting different layer structures 102, 103 are formed within the stack 101. Such vias 104 may for example be blind vias, buried vias or through holes. Some of these vias 104 are electrically conductive providing electrical connection between different electrically conductive layer structures 102. Additionally or alternatively, some of these vias 104 are thermally conductive providing thermal pathways for heat flow 130. The vias 104 may be stacked laser vias extending over several layers or layer structures 102, 103, in particular over several insulating layer structures 103. They may have been drilled mechanically and/or by means of a laser. The vias 104 may extend through the whole component carrier, i.e., through all layers 102, 103 (plated through holes PTH).

The component carrier 100 further comprises a component 110. The component 110 is assembled to the stack 101 at the electrical contacts 111, which may comprise solder bumps. Thermal pathways, configured for conducting heat flow 130 away from the component, are thermally linked with the component 110. Such thermal pathways may at least partially coincide with electrical pathways, configured for electrically contacting the component 110. Thermal pathways may thermally connect the component 110 through the electrical contacts 111.

Finally, the component carrier 100 comprises a thermally conductive tongue 120 having an embedded portion 121 embedded in the stack 101 and having an exposed portion 122 exposed with respect to the stack 101. The tongue 120 is arranged on the same level as an electrically insulating layer 103 of the stack. The embedded portion 121 of the tongue is arranged below a layer structure 102, 103 of the stack 101 as well as above a layer structure 102, 103 of the stack 101. The thermally conductive tongue 120 is configured for conducting heat away from the interior of the stack 101. In other words, it provides a thermal pathway for enabling heat flow 130 away from the interior of the stack. Thermal pathways link the component 110 with the thermally conductive tongue 120 thus enabling heat removal from the component 110 through the tongue 120 to the surroundings of the component carrier 100. Thermal pathways contacting the thermally conductive tongue 120 may for example comprise vias 104, in particular stacked laser vias and/or plated through holes.

Figure 2A:
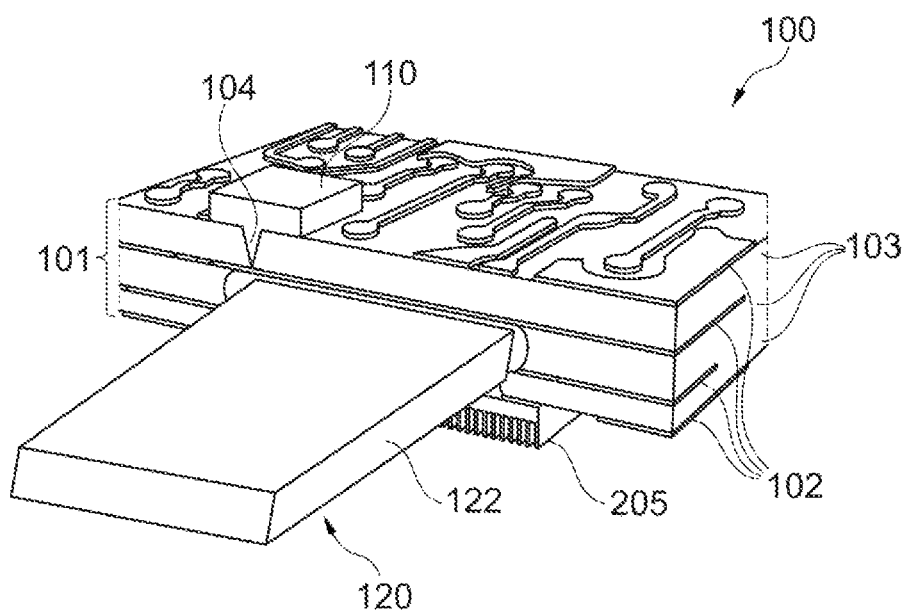
FIG. 2A and FIG. 2B show perspective views of component carriers with a thermally conductive tongue according to exemplary embodiments of the invention.

FIG. 2A shows a component carrier 100 with a thermally conductive tongue 120 according to an exemplary embodiment of the invention. The component carrier 100 of FIG. 2A has essentially the same features as the component carrier 100 of FIG. 1, but is shown in a perspective view rather than a cross-sectional view. In the depicted embodiment, the via 104 connecting the component 100 with the thermally conductive tongue 120 extends over a single electrically insulating layer 103, i.e., is a single-layer laser via. Of course, the connection between the component 110 and the thermally conductive tongue 120 may also involve stacked laser vias extending over several layer structures, in particular several electrically insulating layers 103. A heatsink 205 including fins or pins is attached at the bottom of the component carrier 100.

Figure 2B:
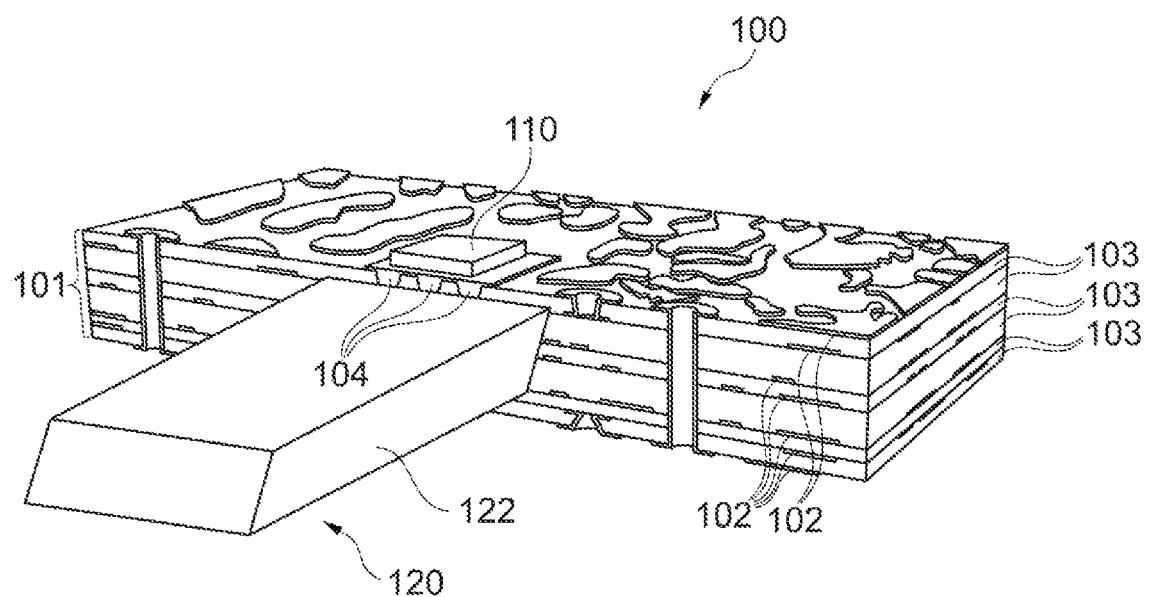

FIG. 2B shows a preferred component carrier 100 with a thermally conductive tongue 120 according to an exemplary embodiment of the invention. The component carrier 100 of FIG. 2B has essentially the same features as the component carrier 100 of FIG. 1, but is shown in a perspective view rather than a cross-sectional view. In contrast to the embodiment depicted in FIG. 2A, excessive heat from the interior of the component carrier 100 is transported by the thermally conductive tongue 120 without requiring the additional use of a heatsink 205.

Figure 3:
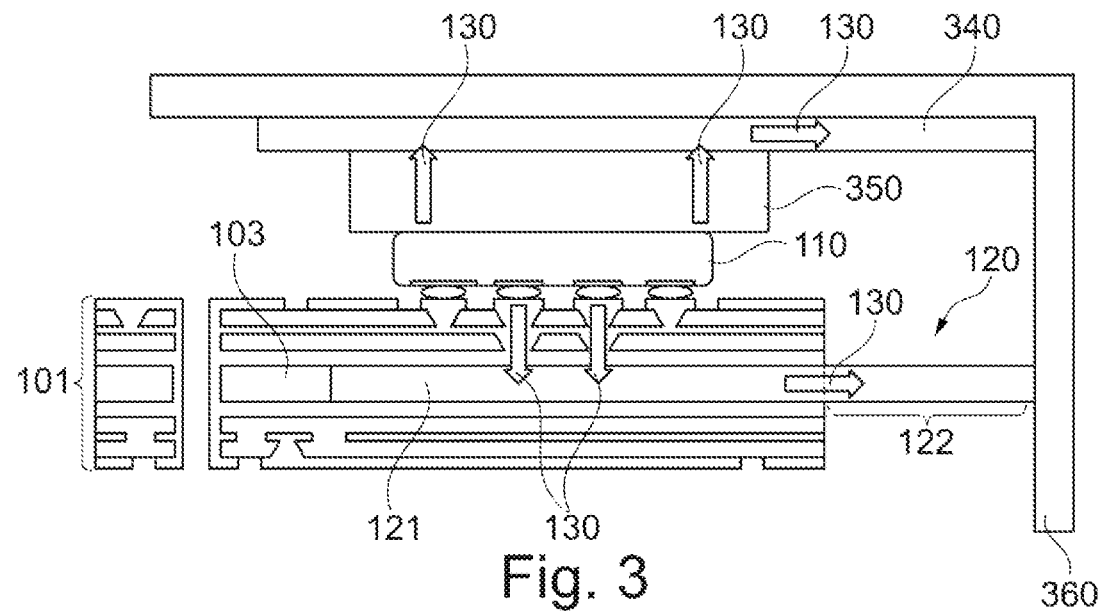
FIG. 3 shows a cross-sectional side view of a component carrier with a thermally conductive tongue and a further thermally conductive tongue according to an exemplary embodiment of the invention.

FIG. 3 shows a component carrier 100 with a thermally conductive tongue 120 according to an exemplary embodiment of the invention. The component carrier 100 of FIG. 3 has the same features as the component carrier 100 of FIG. 1. In addition, a heat spreader 350 is arranged above the component 110 and a further thermally conductive tongue 340 is arranged above the heat spreader 350. This arrangement enables heat flow 130 from the component 110 through the heat spreader 350 to the further thermally conductive tongue 340. The further thermally conductive tongue 340 is configured for enabling heat flow 130 away from the heat spreader 350.

Furthermore, the thermally conductive tongue 120 and the further thermally conductive tongue 340 are in contact with a housing or casing 360. This casing 360 may also be thermally conductive enabling heat spreading and removal from the conductive tongues 120, 340 to the surroundings.

FIG. 4 to FIG. 12B show structures obtained during manufacture of a component carrier 100 with a thermally conductive tongue 120 according to an exemplary embodiment of a method of manufacture. In these figures, the part of the original stack 101, which will eventually form the stack 101 of the finished component carrier 100, is shown to the left of the inlay 423, which inlay 423 will eventually form the thermally conductive tongue 120. The part of the original stack 101, which will eventually be removed, when the thermally conductive tongue 120 is formed, is shown to the right of the inlay 423 or thermally conductive tongue 120.

The method of manufacturing a component carrier 100 may be summarized as comprising (i) forming a stack 101 comprising at least one electrically conductive layer structure 102 and/or at least one electrically insulating layer structure 103; (ii) assembling a component 110 to the stack 101; and (iii) forming a thermally conductive tongue 120 having an embedded portion 121 embedded in the stack 101 and having an exposed portion 122 protruding beyond the stack 101, wherein a first width w1 of the tongue 120 in the embedded portion 121 is larger than a second width w2 of the tongue 120 in the exposed portion 122.

Figure 4:
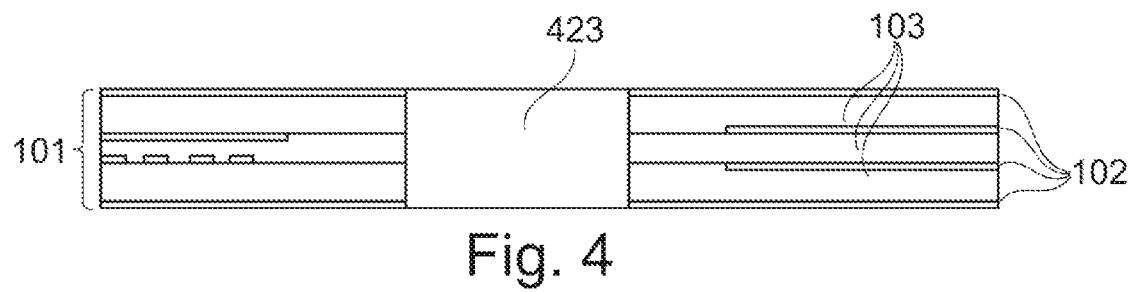
FIG. 4, FIG. 5, FIG. 6, FIG. 7, FIG. 8, FIG. 9, FIG. 10A, FIG. 10B, FIG. 11A, FIG. 11B, FIG. 12A and FIG. 12B show structures obtained during manufacture of a component carrier with a thermally conductive tongue according to an exemplary embodiment of a method of manufacture. Different letters in the numbering of these figures indicate different perspectives on the same or similar structures, e.g., top view and side view.

FIG. 4 shows a stack 101 with electrically conductive layer structures 102 and electrically insulating layer structures 103. An inlay 423 is integrated into the stack 101. The thermally conductive tongue 120 (not shown) of the finished or completed component carrier 100 will eventually be formed by the inlay 423. The inlay 423 is integrated into the stack 101 such that the main surfaces of the inlay 423 are level with the main surfaces of the stack 101. The stack 101 may surround the inlay 423 at all side surfaces or may only partially surround the inlay 423.

Figure 5:
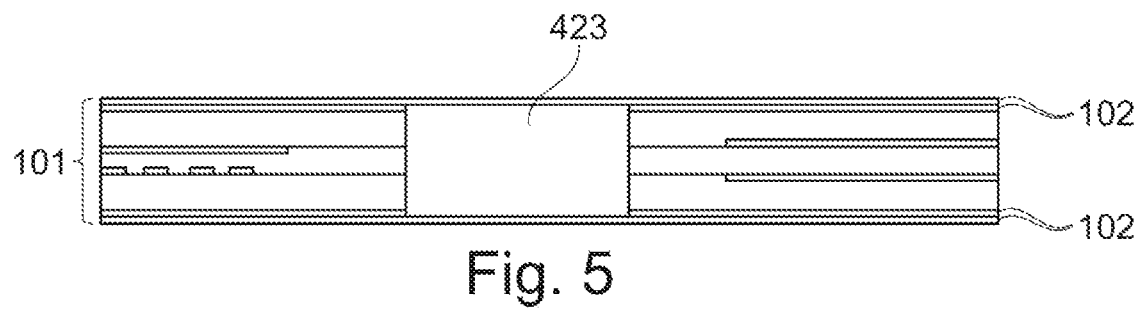

FIG. 5 shows the stack 101 of FIG. 4, wherein a further electrically conductive layer 102 has been attached to each of the main surfaces of the stack 101. These further electrically conductive layers 102 may for example be plated layers, in particular plated copper layers.

Figure 6:
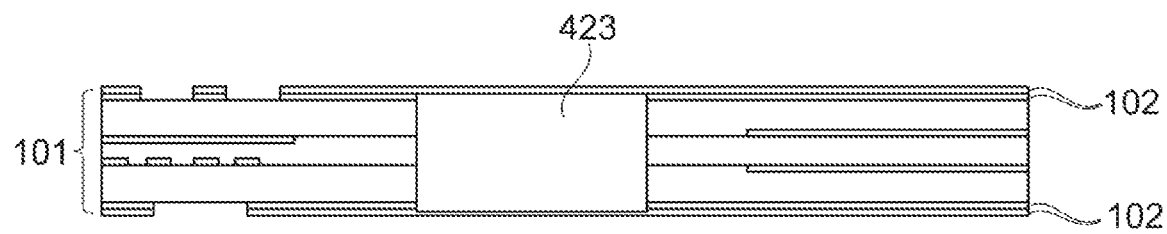

FIG. 6 shows the stack 101 of FIG. 5, wherein the two uppermost electrically conductive layers 102 and the two lowermost electrically conductive layers 102 have been structured. They have been structured in the part of the stack 101, which will eventually form the stack 101 of the finished component carrier 100, i.e., in the part of the stack 101, which will not be removed.

Figure 7:
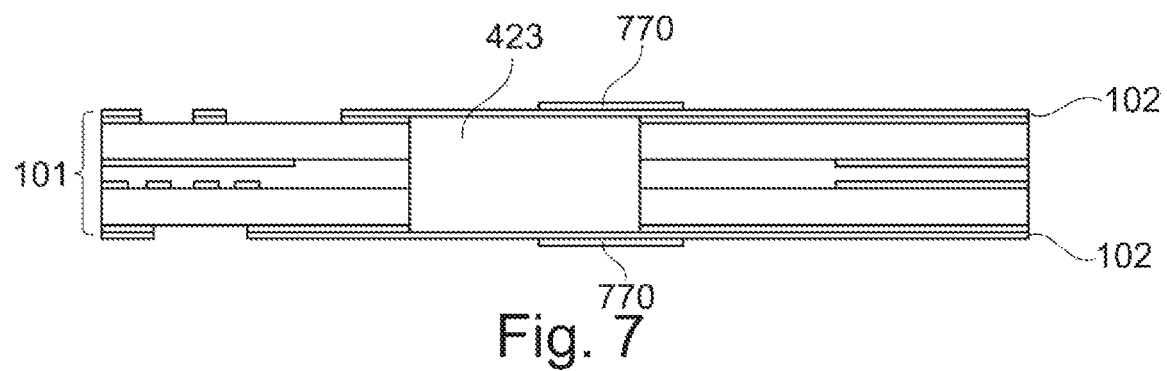

FIG. 7 shows the stack 101 of FIG. 6, wherein release layers 770 have been applied on parts of both main surfaces of the stack 101 as well as on parts of both main surfaces of the inlay 423, in particular of the inlay 423 covered with the electrically conductive layer 102, which was applied in the step shown in FIG. 5. Those parts of the inlay 423, to which the release layer 770 is applied, may eventually form the exposed portion 122 of the thermally conductive tongue 120. Those parts of the inlay 423, to which no release layer 770 is applied, may eventually form the embedded portion 121 of the thermally conductive tongue 120. The release layer 770 may also be applied to parts of the stack 101, which will eventually be removed, in particular in an area surrounding that part of the inlay 423, which will eventually form the exposed portion 122. The release layer 770 may be absent on those parts of the stack 101, which are not removed and which eventually form the stack 101 of the finished component carrier 100.

Figure 8:
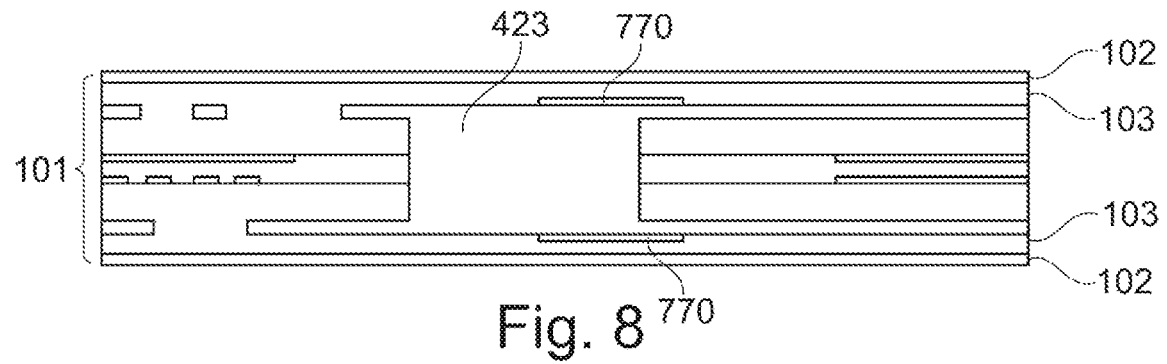

FIG. 8 shows the stack 101 of FIG. 7, wherein a respective electrically insulating layer structure 103 and a respective electrically conductive layer structure 102 have been attached, in particular laminated, to both main surfaces of the stack 101.

Figure 9:
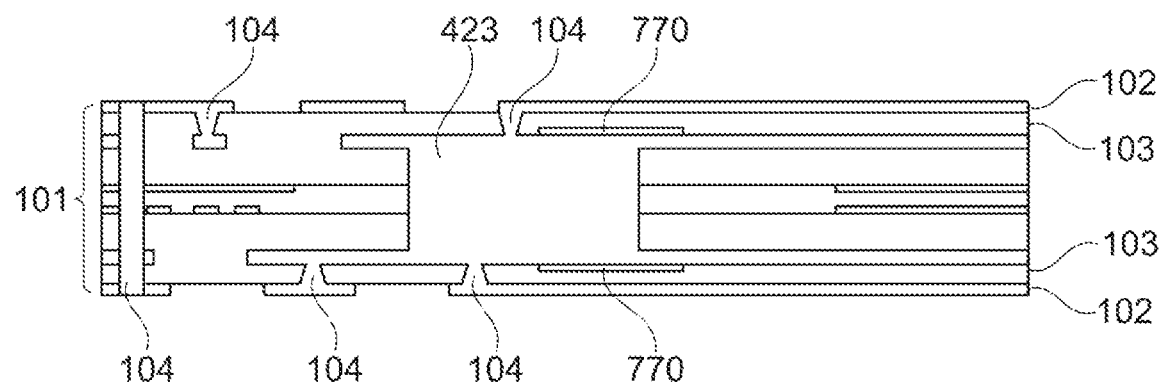

FIG. 9 shows the stack 101 of FIG. 8, wherein the uppermost and lowermost electrically conductive layer structures 102 have been plated and/or structured. Also, various vias 104 have been formed, in particular drilled. Some of these vias 104 contact the inlay 423, in particular the electrically conductive layer structures 102 covering the inlay 423, which were applied in the step shown in FIG. 5. The vias 104 may contact the inlay 423, where the release layer 770 is not present. They may contact the inlay 423 in a part of the stack 101, which will not be removed, when the exposed portion 122 of the tongue 120 is exposed.

Figure 10A:
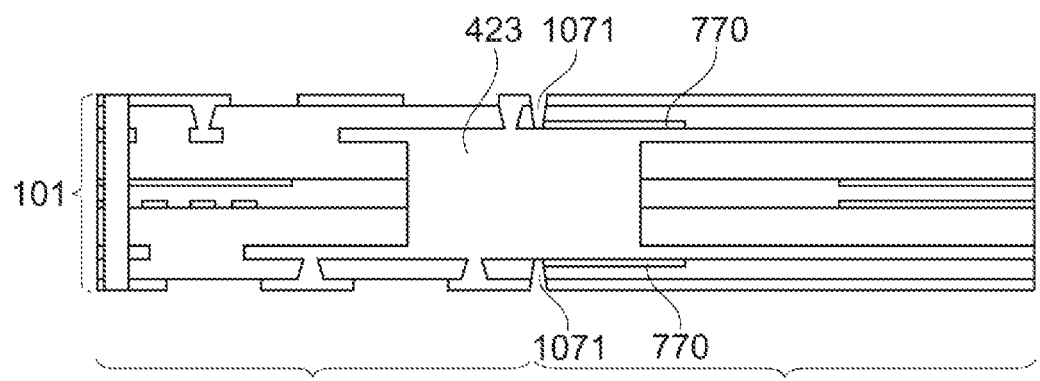
Figure 10B:
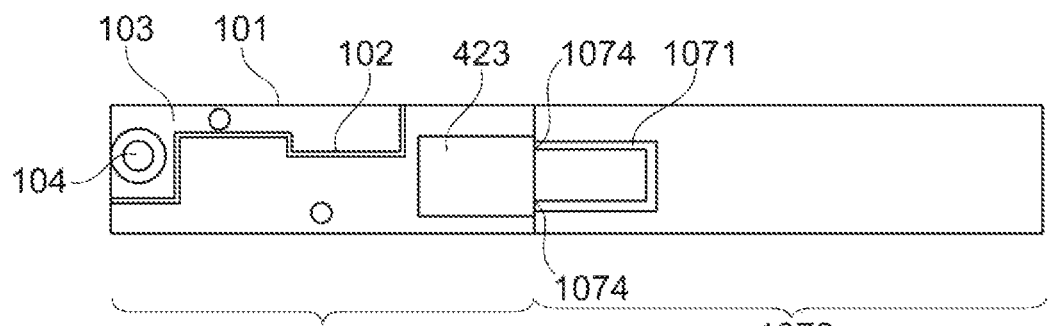

FIGS. 10A and 10B show a cross-sectional side view and a top view, respectively, of the stack 101 of FIG. 9, wherein a cut 1071 is made between the permanent part 1072 and the disposable part 1073 of the stack 101. The permanent part 1072 may be the part of the original stack 101, which will form the stack 101 of the finished component carrier 100. The disposable part 1073 may be the part of the original stack 101, which will be removed, when the exposed portion 122 of the tongue 120 is exposed. Cutting may be carried out by laser cutting and/or milling.

FIG. 10A shows cuts 1071, e.g., laser cuts, which reach from a main surface of the stack 101 to the release layer 770, in particular to an outer edge of the release layer 770.

FIG. 10B shows, how the exposed portion 122 of the tongue is separated from the disposable part of the stack 1073, e.g., by milling. A circumferential or peripheral portion of the original tongue 120 is cut as well and is eventually removed, resulting in one or more stepped edges 1074 of the tongue 120.

Figure 11A:
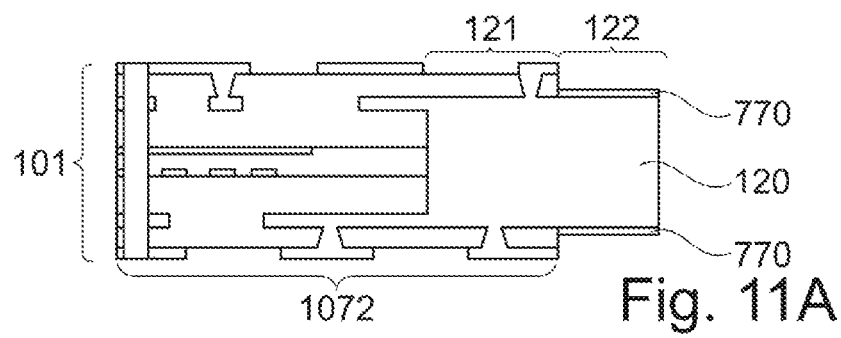
Figure 11B:
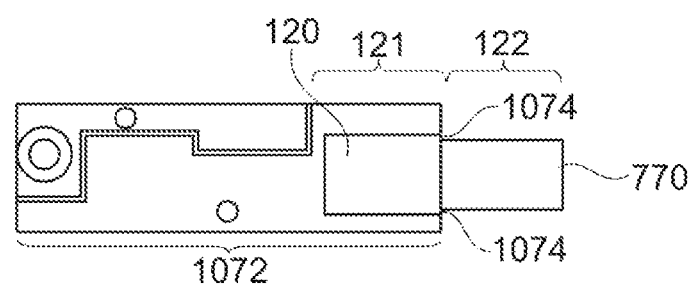

FIG. 11A and FIG. 11B show a cross-sectional side view and a top view, respectively, of the stack 101 of FIGS. 10A and 10B, wherein the disposable part 1073 (not shown) of the original stack 101 has been removed so that only the permanent part 1072 of the original stack 101 remains. By removing the disposable part 1073 a thermally conductive tongue 120 is formed from the inlay 423. The thermally conductive tongue 120 comprises an embedded portion 121 embedded in the permanent part 1072 of the stack 101 and an exposed portion 122, which has been exposed by removing the disposable part 1073 of the stack 101. A respective release layer 770 is still present on the upper and lower surfaces of the exposed portion 122 of the tongue 120 in stacking direction. In FIG. 11B, stepped edges 1074 are shown at the transition between embedded portion 121 and exposed portion 122 of the tongue 120.

Figure 12A:
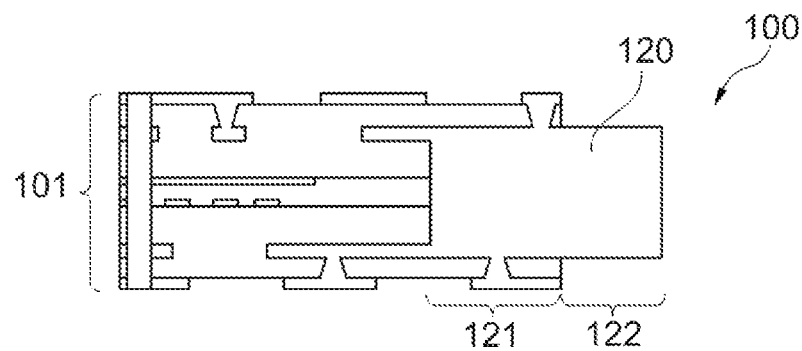
Figure 12B:
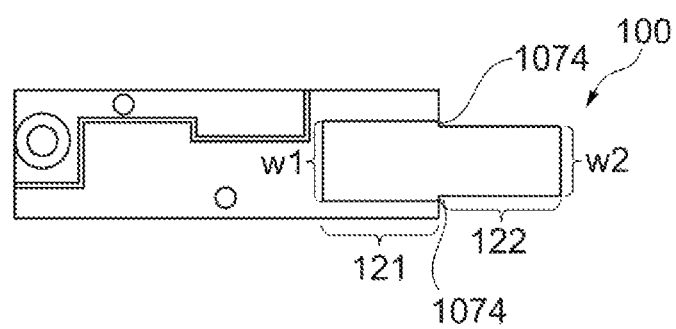

FIG. 12A and FIG. 12B show a cross-sectional side view and a top view, respectively, of the stack 101 of FIGS. 11A and 11B, wherein the release layers 770 (not shown) have been removed from the tongue 120, in particular from the exposed portion 122 of the tongue 120. FIGS. 12A and 12B show a finished component carrier 100 according to an embodiment of the invention. The component carrier 100 comprises a thermally conductive tongue 120 with an embedded portion 121 and an exposed portion 122.

As can be seen in FIG. 12B, the embedded portion 121 has a first width w1 and the exposed portion has a second width w2. Here, the width direction is defined as being perpendicular to the stacking direction of the stack 101 and parallel to the side of the stack 101 from which the exposed portion 122 protrudes. At the transition between the first width w1 and the second width w2, stepped edges 1074 are formed on opposite sides of the tongue 120 in width direction. These stepped edges 1074 are also located at the transition between the embedded portion 121 and the exposed portion 122 of the tongue 120.

FIGS. 13 to 17 show structures obtained during manufacture of a component carrier 100 with a thermally conductive tongue 120 according to an exemplary embodiment of a method of manufacture.

Figure 13:
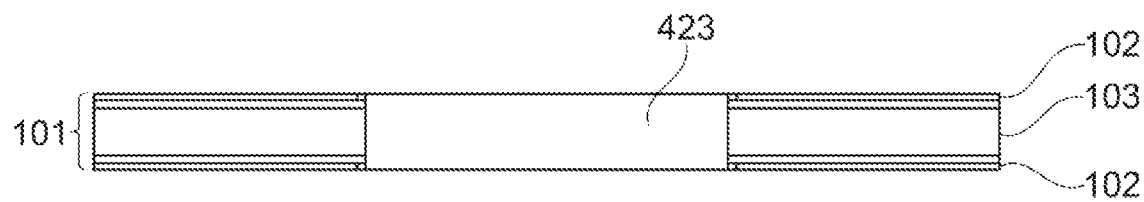
FIG. 13, FIG. 14, FIG. 15, FIG. 16 and FIG. 17 show structures obtained during manufacture of a component carrier with a thermally conductive tongue according to an exemplary embodiment of a method of manufacture.

FIG. 13 shows a stack 101 with electrically conductive layer structures 102 and electrically insulating layer structures 103. An inlay 423 is integrated into the stack 101. The thermally conductive tongue 120 (not shown) of the final component carrier 100 will eventually be formed by the inlay 423. The inlay 423 is integrated into the stack 101 such that the main surfaces of the inlay 423 are level with the main surfaces of the stack 101. The stack 101 may surround the inlay 423 at all side surfaces or may only partially surround the inlay 423. The inlay 423 may be electrically insulated from the electrically conductive layers 102.

Figure 14:
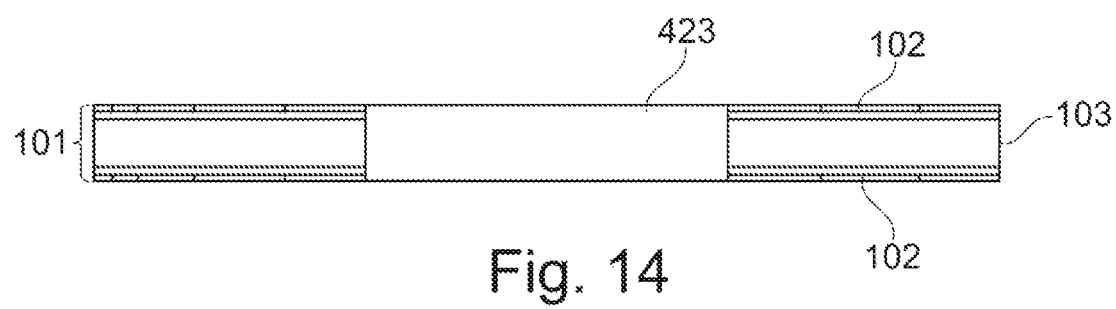

FIG. 14 shows the stack 101 of FIG. 13, wherein the uppermost electrically conductive layer 102 and the lowermost electrically conductive layer 102 have been structured. The inlay 423 may be electrically insulated from these structured electrically conductive layers 102.

Figure 15:
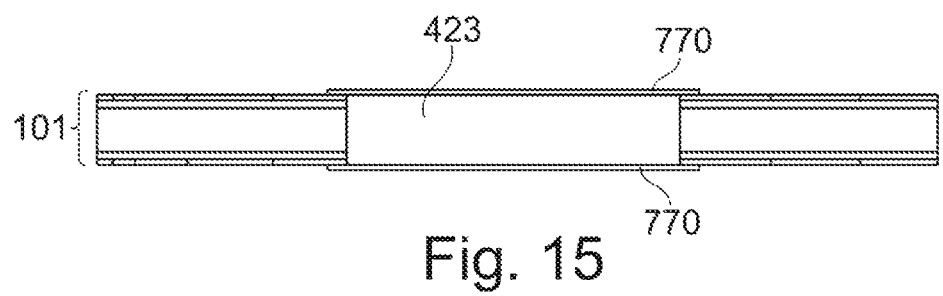

FIG. 15 shows the stack 101 of FIG. 14, wherein respective release layers 770 have been applied on parts of both main surfaces of the stack 101 as well as on parts of both main surfaces of the inlay 423 or even the entire main surfaces of the inlay 423.

Figure 16:
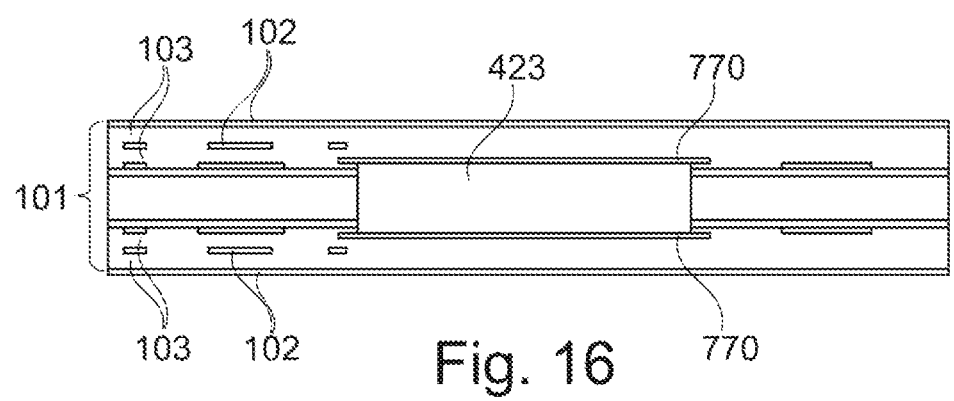

FIG. 16 shows the stack 101 of FIG. 15, wherein additional electrically insulating layer structures 103 and electrically conductive layer structures 102, in particular structured electrically conductive layer structures, have been attached, in particular laminated, to both main surfaces of the stack 101.

Figure 17:
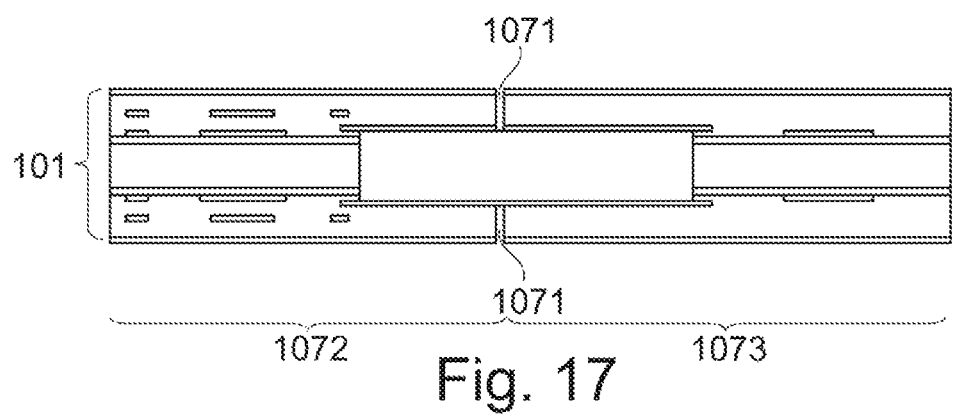

FIG. 17 shows the stack 101 of FIG. 16, wherein a cut 1071 is made between the permanent part 1072 and the disposable part 1073 of the stack 101. The permanent part 1072 may be the part of the original stack 101, which will form the stack 101 of the finished component carrier 100. The disposable part 1073 may be the part of the original stack 101, which will be removed, when the exposed portion 122 of the tongue 120 is exposed. The cut may be made in such a way that it reaches from an outer surface of the stack 101 only up to the release layer 770.

After cutting the disposable part 1073 from the permanent part 1072, the disposable part 1073 may be removed thereby forming a thermally conductive tongue 120 (not shown) with an exposed portion 122 and an embedded portion 121.

FIGS. 18 to 30 show various geometrical forms and/or arrangements of one or more thermally conductive tongues 120, 340 with respect to a stack 101 according to exemplary embodiments of the component carrier 100. For the sake of clarity and conciseness, the respective changes in width of the thermally conductive tongues 120, 340 are not shown in these figures. In all these figures, the thermally conductive tongues 120, 340 could be rotated by arbitrary angles with respect to the stack 101. Furthermore, the dimensions, in particular length, width and thickness, of the thermally conductive tongues 120, 340 could be arbitrarily changed. In all figures, different exposed portions 122, 1842 may be on the same level in stacking direction or they may be at different levels in stacking direction. Different exposed portions 122, 1842 may be connected by a common embedded portion 121, 1841 or they may be separately formed with different embedded portions 121, 1841. Different exposed portions 122, 1842 may belong or be attributed to the same or to different thermally conductive tongues 120, 340. It should further be understood that the designation as either embedded portion 121 or further embedded portion 1841 is arbitrary as is the designation as exposed portion 122 or further exposed portion 1842.

Figure 18:
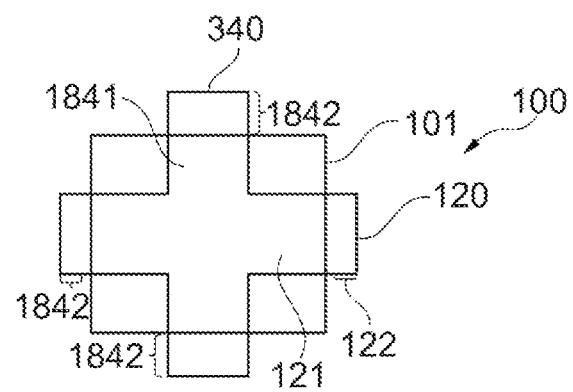
FIG. 18, FIG. 19, FIG. 20, FIG. 21, FIG. 22, FIG. 23, FIG. 24, FIG. 25, FIG. 26, FIG. 27, FIG. 28, FIG. 29 and FIG. 30 show various geometrical forms and arrangements of one or more thermally conductive tongues with respect to a stack according to exemplary embodiments of a component carrier.

FIG. 18 shows thermally conductive tongues 120, 340 arranged in form of a cross with four exposed portions 122, 1842. Each exposed portion 122, 1842 protrudes from a different side of the stack 101. The exposed portions 122, 1842 may have a common embedded portion 121, 1841, i.e., the embedded portions 121, 1841 may be connected. Alternatively, different exposed portions 122, 1842 and different embedded portions 121, 1841 may be separate, e.g., because they are on different levels of the stack. FIG. 18 and the following figures are in general amenable to such different interpretations.

Figure 19:
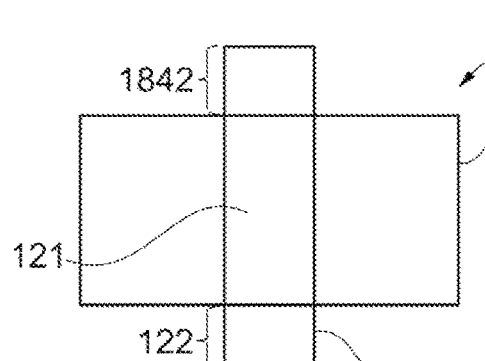
Figure 20:
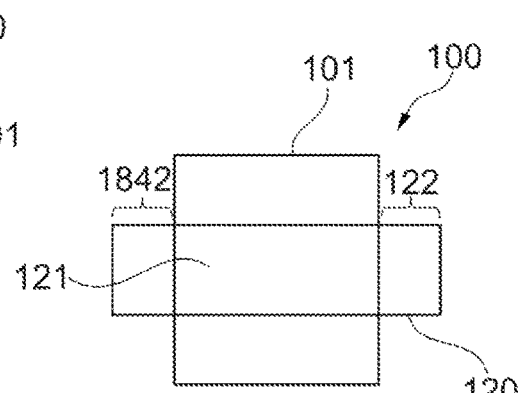

FIG. 19 and FIG. 20 show a thermally conductive tongue 120 of rectangular form with two exposed portions 122, 1842 on opposite sides of the stack.

Figure 21:
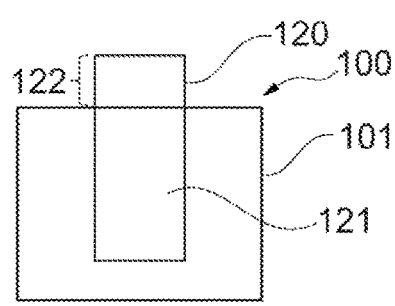

FIG. 21 shows a thermally conductive tongue 120 of rectangular form with a single exposed portion 122.

Figure 22:
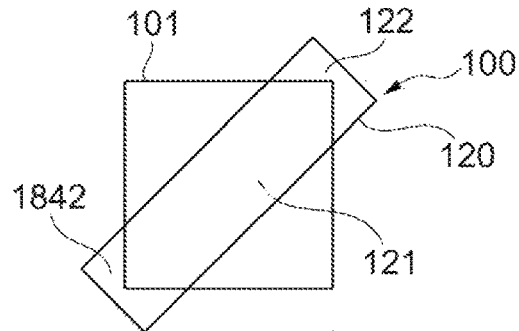

FIG. 22 shows a thermally conductive tongue 120 of rectangular form with two exposed portions 122, 1842 arranged diagonally with respect to the stack 101. The exposed portions 122, 1842 overlap with opposite corners of the stack 101.

Figure 23:
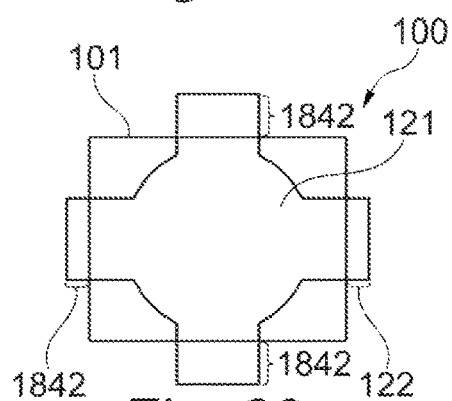

FIG. 23 shows one or more thermally conductive tongues 120, 340 arranged in form of a cross with four exposed portions 122, 1842. The embedded portion 121, 1841 comprises a region of circular or oval form.

Figure 24:
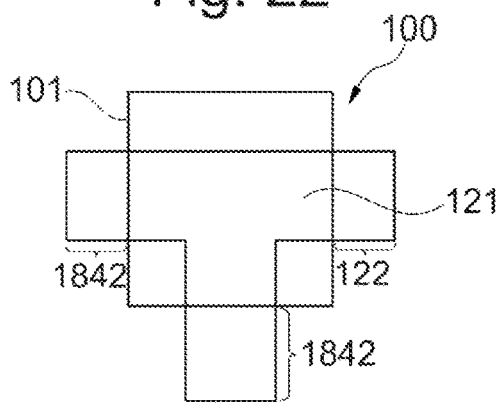

FIG. 24 shows one or more thermally conductive tongues 120, 340 with three exposed portions 122, 1842 in the form of two at least partially overlapping rectangles. The exposed portions 122, 1842 protrude from three different side surfaces of the stack 101.

Figure 25:
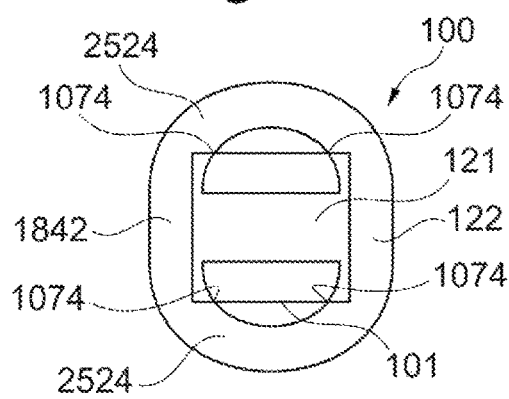
Figure 26:
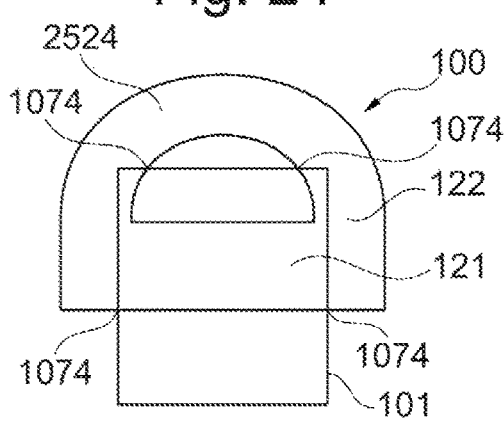
Figure 27:
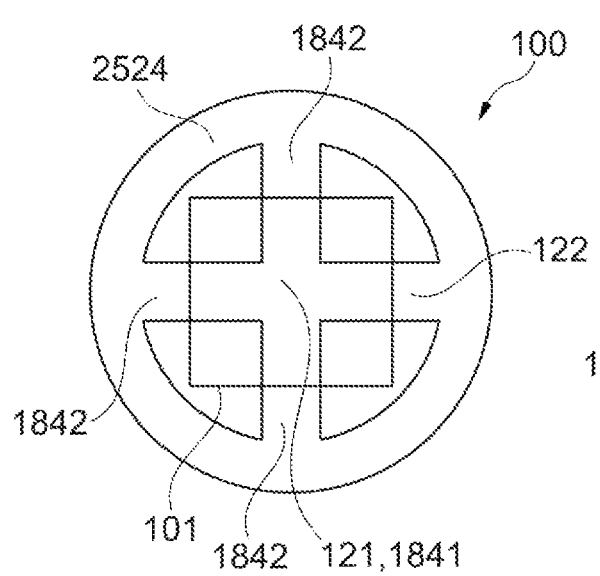
Figure 28:
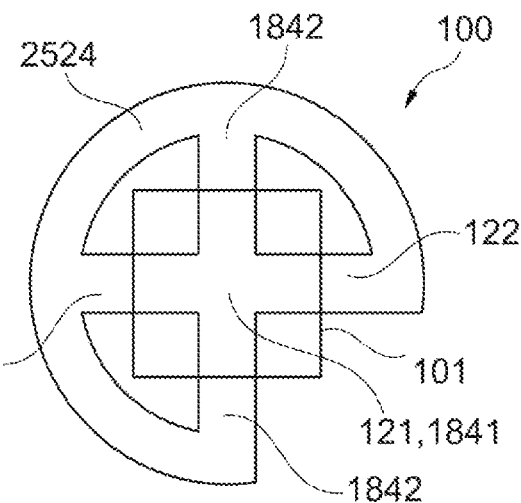
Figure 29:
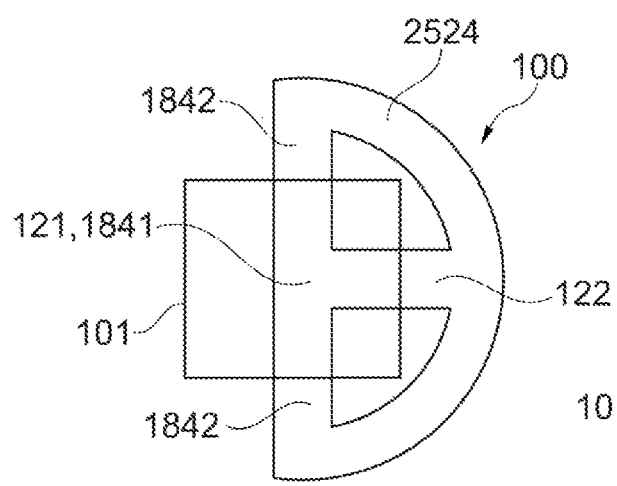
Figure 30:
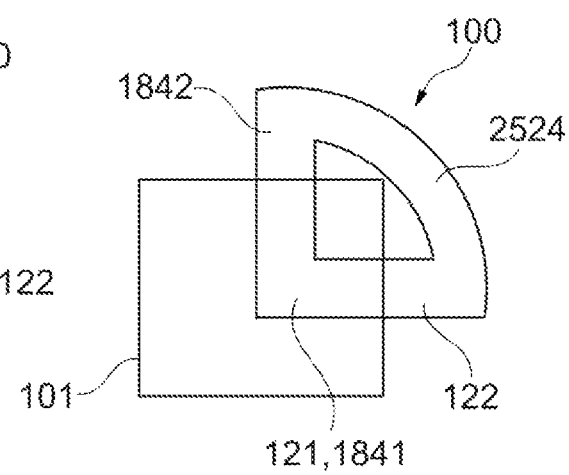

FIG. 25 and FIG. 26 show a thermally conductive tongue 120 of rectangular form with two exposed portions 122, 1842 on opposite sides of the stack. The two exposed portions 122, 1842 are connected by an exposed bridge portion 2524. At least in some regions, the bridge portion 2524 may be completely separated from the stack. The exposed bridge portion 2524 may be a ring-like structure. It may form a full circle as in FIG. 25 or only half a circle as in FIG. 26.

FIGS. 27 to 30 show one or more thermally conductive tongues 120, 340 arranged as two at least partially overlapping rectangles with two, three or four exposed portions 122, 1842. The exposed portions 122, 1842 are connected by an exposed bridge portion 2524. The exposed bridge portion 2524 has a ring-like structure. It may be a full circle as in FIG. 27, three-fourth of a circle as in FIG. 28, half of a circle as in FIG. 29 or a quarter of a circle as in FIG. 30.

It should be noted that the term "comprising" does not exclude other elements or steps and the use of articles "a" or "an" does not exclude a plurality. Also, elements described in association with different embodiments may be combined.

LIST OF REFERENCE SIGNS 100 component carrier
101 stack
102 electrically conductive layer structure
103 electrically insulating layer structure
104 via (through hole, blind via, buried via)
110 component
111 electrical contact
120 thermally conductive tongue
121 embedded portion
122 exposed portion
130 heat flow
205 heat sink
340 further thermally conductive tongue
350 heat spreader
360 casing
423 inlay
770 release layer
1071 cut
1072 permanent part
1073 disposable part
1074 stepped edge
1841 further embedded portion
1842 further exposed portion
2524 bridge portion
w1 first width
w2 second width

The invention claimed is:

1. A method of manufacturing a component carrier, comprising:
    forming a stack comprising at least one electrically conductive layer structure and/or at least one electrically insulating layer structure;
    assembling a component to the stack; and
    forming a thermally conductive tongue having an embedded portion embedded in the stack and having an exposed portion protruding beyond the stack, wherein a first width of the tongue in the embedded portion is different from a second width of the tongue in the exposed portion,
    wherein a stepped edge connects a portion of the tongue having the first width with a portion of the tongue having the second width.

2. The method according to claim 1, wherein a transition between the first width and the second width is at an interface between the embedded portion and the exposed portion.

3. The method according to claim 1, wherein a ratio between the first width and the second width is larger than 3/4 and smaller than 4/3.

4. The method according to claim 1, wherein the tongue is electrically insulated from the component.

5. The method according to claim 1, wherein the exposed portion extends from a side surface of the stack.

6. The method according to claim 1, further comprising:
    arranging at least one layer structure of the stack below the embedded portion and at least one layer structure of the stack above the embedded portion.

7. The method according to claim 1, further comprising:
embedding a release layer above and below the tongue in the stack, wherein the exposed portion of the tongue is formed by separating and removing a part of the stack from the tongue at the release layer.

8. The method according to claim 7, wherein the separating comprises laser cutting and/or milling.

9. A component carrier, comprising:
a stack comprising at least one electrically conductive layer structure and/or at least one electrically insulating layer structure;
a component assembled to the stack; and
a thermally conductive tongue having an embedded portion embedded in the stack and having an exposed portion exposed with respect to the stack, wherein a first width of the tongue in the embedded portion is different from a second width of the tongue in the exposed portion,
wherein a stepped edge connects a portion of the tongue having the first width with a portion of the tongue having the second width.

10. The component carrier according to claim 9, wherein a transition between the first width and the second width is at an interface between the embedded portion and the exposed portion.

11. The component carrier according to claim 9, wherein a ratio between the first width and the second width is larger than 3/4 and smaller than 4/3.

12. The component carrier according to claim 9, wherein the tongue is electrically insulated from the component.

13. The component carrier according to claim 12, wherein the exposed portion is thermally coupled with a thermally conductive body outside the component carrier.

14. The component carrier according to claim 9, wherein the exposed portion extends from a side surface of the stack.

15. The component carrier according to claim 9, wherein the exposed portion is bent.

16. The component carrier according to claim 9, further comprising:
a further thermally conductive tongue.

17. The component carrier according to claim 9, wherein a material of the tongue comprises at least one of: an electrically conductive material, an electrically non-conductive material, copper, aluminium, a ceramic, a metallic composite, a bimetal, a non-metallic material, and a magnetic material.

18. The component carrier according to claim 9, wherein the tongue comprises a cavity filled with a gaseous medium and/or a liquid medium.

* * * * *